United States Patent [19]
Von Basse et al.

[11] Patent Number: 5,751,742
[45] Date of Patent: May 12, 1998

[54] SERIALLY ACCESSIBLE MEMORY MEANS WITH HIGH ERROR CORRECTABILITY

[75] Inventors: Paul-Werner Von Basse, Wolfratshausen; Michael Bollu, Munich; Roland Thewes, Puchheim; Doris Schmitt-Landsiedel, Ottobrunn, all of Germany

[73] Assignee: Siemens Aktiengesellschaft, Munich, Germany

[21] Appl. No.: 626,512

[22] Filed: Apr. 2, 1996

[30] Foreign Application Priority Data

Apr. 5, 1995 [DE] Germany .............. 195 12 791.9

[51] Int. Cl.[6] ................................... G11C 8/04
[52] U.S. Cl. ........................ 371/40.18; 365/240
[58] Field of Search ................. 371/40.1, 40.18; 365/240

[56] References Cited

U.S. PATENT DOCUMENTS 4,703,453  10/1987  Shinoda et al. ............. 365/104
4,758,989   7/1988  Davis et al. ................. 365/189
5,450,424   9/1995  Okugaki et al. ............. 371/40.1

FOREIGN PATENT DOCUMENTS 0 290 042 A2   9/1988   European Pat. Off.

OTHER PUBLICATIONS

IBM Technical Disclosure Bulletin –vol. 27, No. 3 Aug. 1984, pp. 1756.1757.

Primary Examiner—Stephen M. Baker
Attorney, Agent, or Firm—Hill, Steadman & Simpson

[57] ABSTRACT

In a serially working memory unit with a memory matrix, a row selection unit and a column selection unit are configured such that, given faulty rows or columns, only correctable, single errors or errors of few successive bits occur. This memory unit offers advantages particularly for read-only memories since, due to the memory contents that are already determined during manufacture, substitute rows or columns can thereby not be provided.

7 Claims, 4 Drawing Sheets

$Z = 7, S = 6, ZSW = 1, SSW = 1, FB = 2$ $Z = 4, S = 5, ZSW = 1, SSW = 1, FB = 1$

Z = 8, S = 7, ZSW = 3, SSW = 2, FB = 1

Z = 8, ZSW = 3

S = 7, SSW = 2

SERIALLY ACCESSIBLE MEMORY MEANS WITH HIGH ERROR CORRECTABILITY

BACKGROUND OF THE INVENTION

In a serial memory having a main memory area arranged in matrix-like fashion, a respective line is first usually selected and each individual bit line is subsequently sequentially activated, as a result whereof the memory contents of a row can be read out or overwritten. Given errors in the form of completely failing rows and/or columns, which occur significantly more often than errors randomly distributed over the entire cell field as a consequence of the dependent failure probabilities, an error correction is not possible, or is only marginally possible. The problem of error correctability given completely failed rows or columns particularly arises in conjunction with read-only memories (ROMs) since their memory content is already defined during manufacture, and alternate rows or alternate columns cannot be provided in the way possible given, for example, read-write memories.

European Patent Application EP 0 290 042 A2 discloses a memory unit with serial access having a memory matrix whose memory cells are arranged in M rows and N columns and are connected to row lines and column lines, having a column selection unit that is connected to the column lines and cyclically moves one column forward with every clock signal, and having a row selection unit that is connected to the row lines and moves one row forward in the row selection with a clock signal.

The plurality of shift register stages in the column selection unit is thereby reduced by a gate circuit in the column selection unit.

IBM Technical Disclosure Bulletin, August 1984, pages 1756 and 1757 discloses a re-addressing of the bits of data words in order to handle the problems in the correction of column or row errors with redundant code.

U.S. Pat. No. 4,703,453 discloses the fact that memory words can be compiled from memory cells that do not lie adjacent to one another in the memory, but are arranged in distributed fashion in the memory in order to eliminate problems in the correction of multiple errors.

SUMMARY OF THE INVENTION

An object underlying the invention is to specify a memory unit with serial access wherein only errors that, for example, can be corrected with a redundant code occur either in case of a defective row or in case of a defective column.

In a memory unit of the invention with serial access, a memory matrix is provided having memory cells arranged in Z rows and S columns, and wherein the memory cells are connected to row lines and column lines. A row clock signal and a column clock signal are formed from an external clock signal in a clock logic unit. A row selection unit is connected to the row lines and is indexed cyclically by a predetermined row skip width ZSW for row selection with every row clock signal. A column selection unit is connected to the column lines and is indexed cyclically by a predetermined column skip width SSW for column selection with every column clock signal. The row selection unit and the column selection unit are designed such that a respectively new row is already selected after n columns have been selected or a respectively new column is selected after m rows have been selected, where n is smaller than S and m is smaller than Z, and a higher of the two numbers n and m represents a plurality of bits in a memory word that can still be corrected by a code.

The invention is described in greater detail below with reference to the drawings.

DESCRIPTION OF THE PREFERRED EMBODIMENTS

Figure 1:
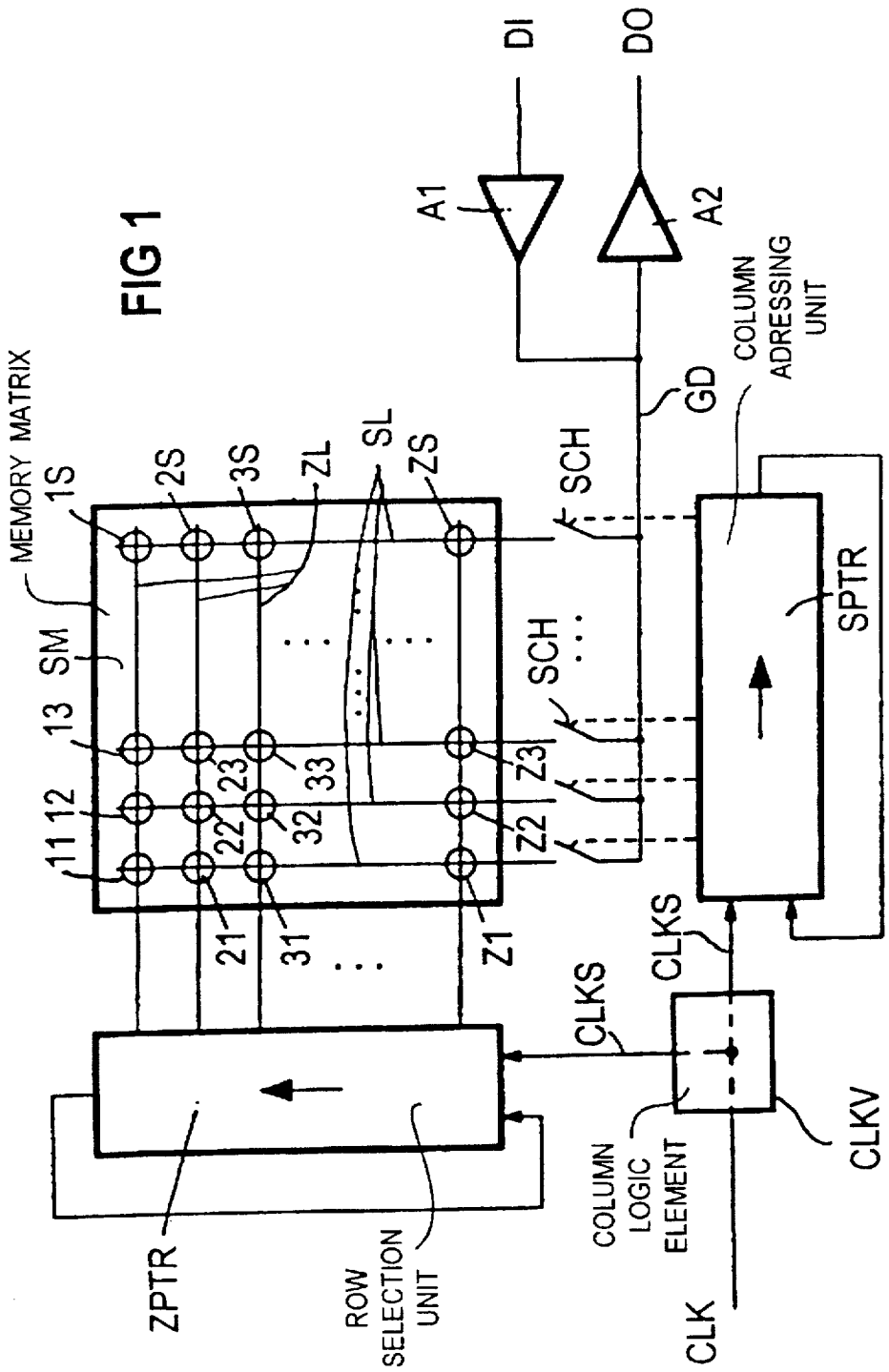
FIG. 1 is a block circuit diagram of an inventive memory unit with serial access according to the invention.

FIG. 1 shows a memory unit with serial access that comprises a memory matrix SM whose memory cells 11 ... ZS are arranged in Z rows and S columns and whose memory cells are respectively connected to row lines ZL and column lines SL. Beyond this, the memory unit of the invention comprises a row selection unit ZPTR that is driven by a row clock signal CLKZ and whose outputs are connected to the row lines. Further, a signal return that indicates a cyclical selection of the row lines ZL is entered at the row selection unit ZPTR. Beyond this, the memory unit of the invention comprises a column selection unit that is composed of switches SCH and of a column addressing unit SPTR, whereby one switch is provided for each column of the memory matrix SM and each switch is connected to a respective output of the column addressing unit SPTR. The column addressing unit SPTR is driven by a column clock signal CLKS, and an illustrated signal return indicates a cyclical addressing. The switches SCH have the job of respectively connecting an addressed column line to a common or shared data line GD. External input data DI are amplified by an existing input amplifier A1 and are applied to the common data line GD, and output data present on the common data line GD are amplified by an output amplifier GD before they are available as external output data DO. The row clock signal CLKZ and the column clock signal CLKS are formed from an external clock signal CLK in a column logic element CLKV. The column logic element CLKV is composed, for example, of two frequency-divider circuits on the basis of flip-flops. In the simplest case, both the row clock signal as well as the column clock signal are identical to the external clock signal CLK; and the circuit CLKV, as indicated with broken lines in FIG. 1, is merely composed of connections to the external clock signal.

Figure 2:
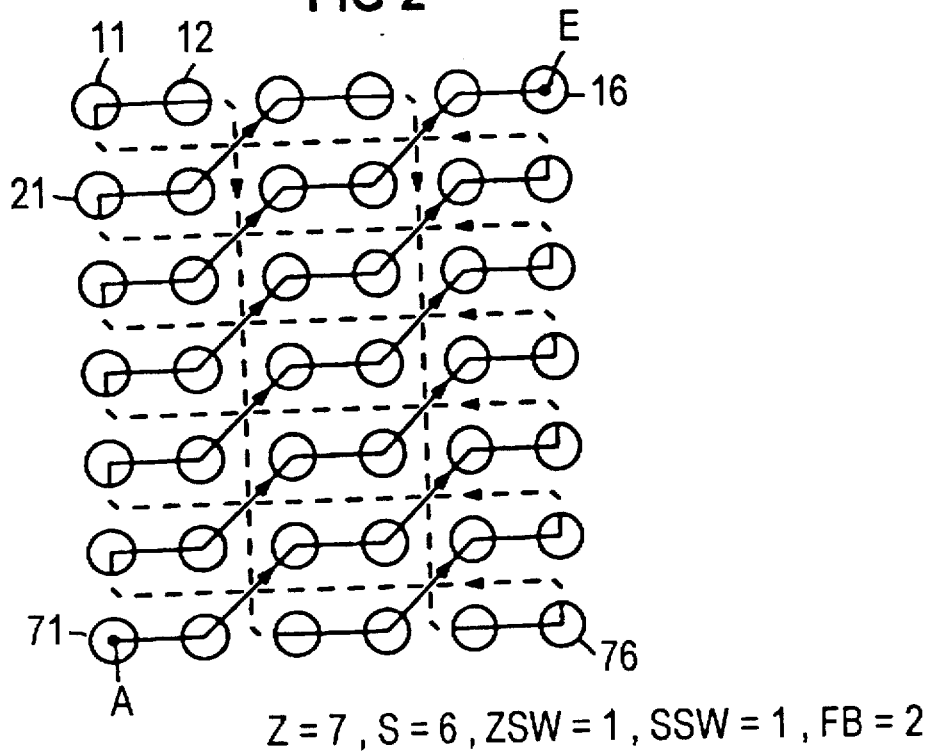
FIG. 2 is an illustration for explaining the access sequence with two successive cells of an identical row.

FIG. 2 shows a memory matrix SM having Z=7 rows and S=6 columns with the memory cells 11 ... 76 in simplified fashion by way of example, whereby the memory cell 71 has been selected as starting cell A; and thus the memory cell 16 forms the end cell E. The memory cells are named in the fashion of a matrix indexing. After FB=2 successive columns, a row change also respectively occurs in addition to a column change, whereby a transition back into the first column from the sixth column respectively occurs. The access sequence within the physical boundaries of the cell field of the memory matrix SM is indicated with the assistance of solid lines and the transitions across the physical boundaries of the cell field are indicated with broken lines.

At every transition to a further memory cell, indexing is either not undertaken at all or is only undertaken to the immediately next row as well as to the immediately next column, i.e. both the row skip width ZSW as well as the column skip width SSW respectively amounts to one here.

When a maximum of all cells of a row are defective, only a maximum of two faulty bits in respectively one of S/FB=3 blocks read out occur for each Z*FB=14 cells, given the access sequence shown in FIG. 2. The first block to be read out here is composed of the cells 71, 72, 63, 64, 55, 56, 41, 42, 33, 34, 25, 26, 11, 12.

An access sequence with FB=2 can be achieved by an arrangement according to FIG. 1 when cyclical shift registers are employed as a row selection unit and as a column selection means, when the clock ratio CLKZ/CLKS=0.5 applies and the conditions S MOD FB=0 and GGT(Z,S/FB)=1 are adhered to with respect to the memory dimensioning. GGT denotes the greatest common divisor and MOD denotes the modulo function.

When the conditions are not met, additional switch devices are required in the row and column selection means, these not being able to be specified per se in general for all memory dimensionings in a simple way, but being relatively easy to develop for the specific, individual case.

Figure 3:
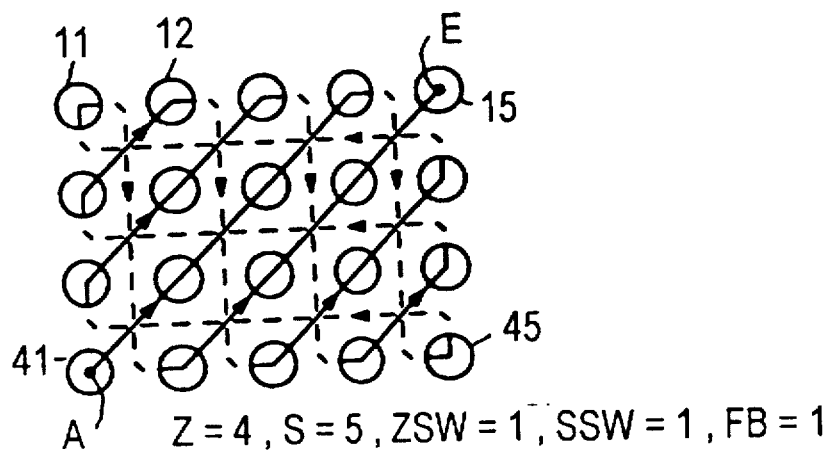
FIG. 3 is a further illustration for explaining the access sequence with one cell without an immediately following cell in an identical row.

FIG. 3, by way of example, shows a memory matrix SM with Z=4 rows and S=5 columns with the memory cells 11 ... 45 in simplified fashion, whereby the memory cell 41 has been selected as the starting cell A and thus the memory cell 15 forms the end cell E, and whereby the memory cells are named in the fashion of a matrix indexing. After FB=1 successive columns, a row change also thereby occurs in addition to a column change, whereby a switch back into the first column respectively ensues from the fifth column. The access sequence within the physical boundaries of the cell field of the memory matrix SM is indicated with the assistance of solid lines, and the transitions across the physical boundaries of the cell field are indicated with broken lines.

At every transition to a further memory cell, indexing is carried out only to the immediately next row as well as to the immediately next column, i.e. both the row skip width ZSW as well as the column skip width SSW respectively amounts to one here.

When a maximum of all cells of a row are defective in the access sequence shown in FIG. 3, only a maximum of one faulty bit in respectively one of S/FB=5 blocks read out for respectively Z*FB=4 cells occurs. The first block to be read out is composed of the cells 41, 32, 23, 14 here.

An access sequence with FB=1 can be achieved by an arrangement of FIG. 1 when cyclical shift registers are employed as a row selection unit and as a column selection unit and when the clock ratio CLKZ/CLKS equals 1 and the condition GGT(Z,S)=1 is observed in view of the memory dimensioning.

Since, in case of error, the faulty cells are often concentrated not only in one row and/or column but wherein neighboring rows and/or neighboring columns are also affected, it can be advantageous under certain circumstances to select the row skip width and/or the column step width differing from 1.

Figure 4:
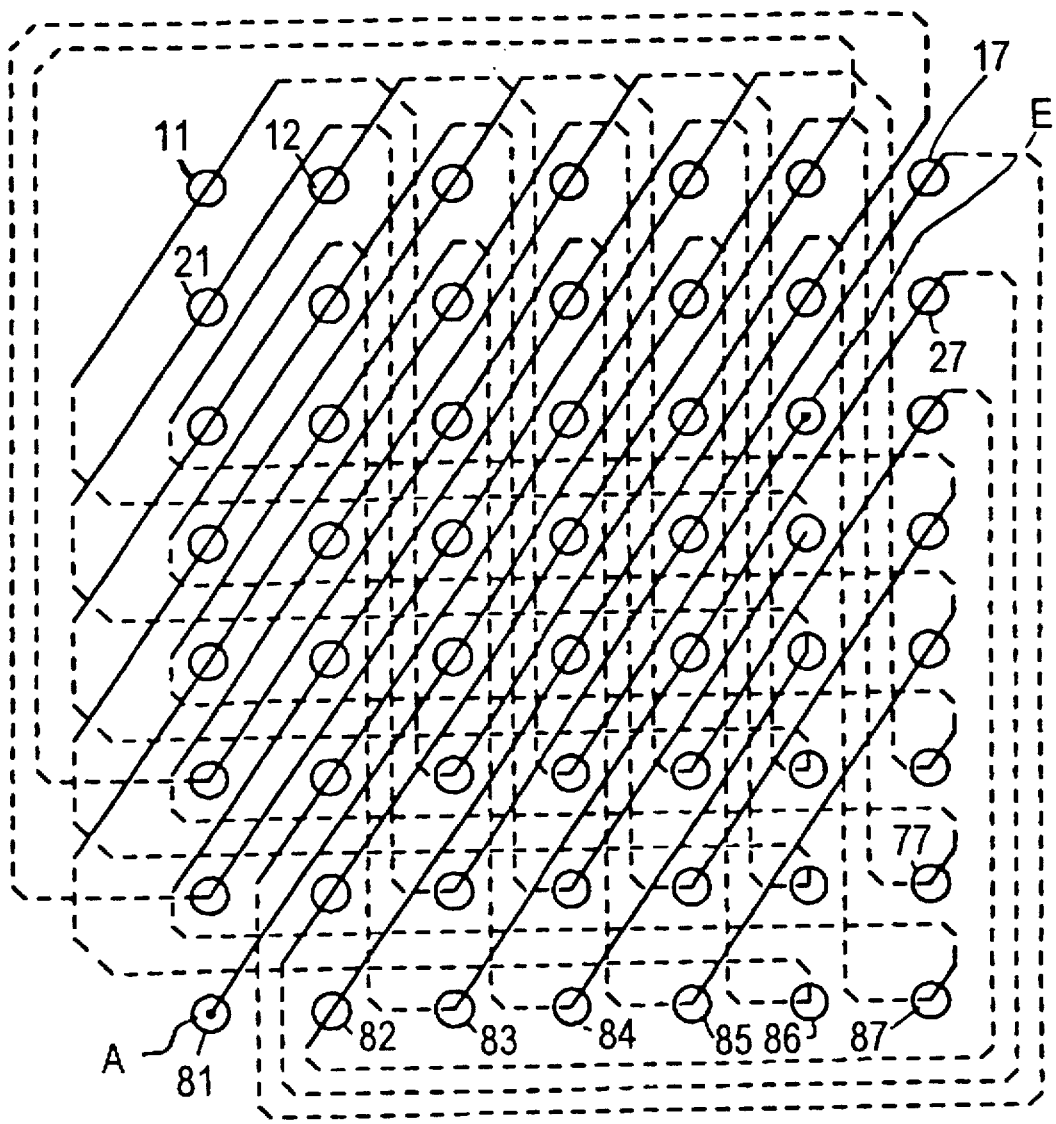
FIG. 4 is another illustration for explaining the access sequence with one cell without an immediately following cell in an identical row and with row and column step sizes greater than one.

By way of example, FIG. 4 shows a memory matrix with the memory cells 11 ... 87 having eight rows and seven columns, whereby the cell 81 was selected as starting cell A, and thus the cell 36 represents the end cell E, and whereby the memory cells are named as in a standard matrix indexing. In this case, the row skip width ZSW amounts to three and the column skip width SSW amounts to two. Beginning with A and ending with E, the memory cells are connected to one another by a graph in the sequence of the access, whereby the transitions beyond the edge of the physical edge are shown with broken lines, and all other transitions are shown with solid lines. The memory cells are thereby addressed in the sequence indicated below.

81, 53, 25, 77, 42, 14, 66,
31, 83, 55, 27, 72, 44, 16,
61, 33, 85, 57, 22, 74, 46,
11, 63, 35, 87, 52, 24, 76,
41, 13, 65, 37, 82, 54, 26,
71, 43, 15, 67, 32, 84, 56,
21, 73, 45, 17, 62, 34, 86,
51, 23, 75, 47, 12, 64, 36.

So that all memory cells of the memory matrix are addressed with Z*S accesses, either additional techniques must be implemented in the row and column selection circuits that implement row or column switches when the last row or last column is respectively reached, or in the case of FB=1, only the row number Z and the column number S of the memory matrix SM and the row skip width ZSW and the column skip width SSW as well are advantageously provided such that the two following conditions $$GGT(S,SSW)=1$$

and $$GGT(Z,(S*ZSW) \, MOD \, Z)=GGT(Z,S*ZSW)=1$$

are met, whereby GGT( ) denotes the greatest common divisor and MOD denotes the modulo operation.

For the memory matrix shown in the example of FIG. 3 and the respective skip widths, GGT(5,1)=1 and GGT(4, (5*1) MOD 4)=1 apply.

The condition GGT(7,2)=1 and the condition GGT(8, (7*3) MOD 8)=GGT(8,(21 MOD 8))=GGT(8,5)=1 are met for the example shown in FIG. 4.

Figure 5:
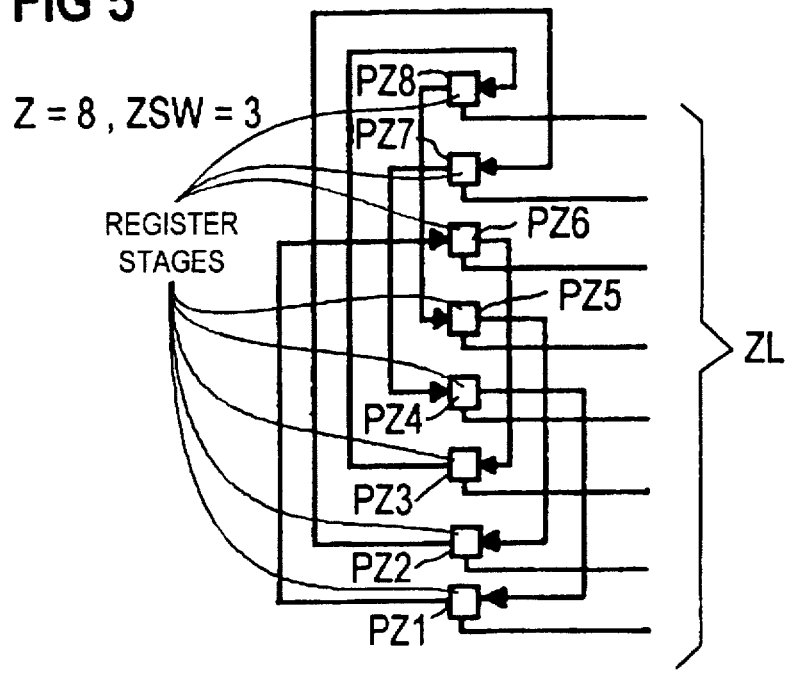
FIG. 5 is a block circuit diagram of the row selection unit of FIG. 1 in the case of the access sequence of FIG. 4.

For the example shown in FIG. 4, FIG. 5 shows a block circuit of a row selection unit ZPTR for eight rows and a row skip width of ZSW=3 in the form of a cyclically switched shift register with the register stages PZ1 ... PZ8. The shift registers PZ1 ... PZ8 are thereby allocated in sequence to the row lines ZL for the rows 1 through 8. Proceeding from a condition PZ8=1 and PZ7 ... PZ1=0, or from a condition PZ8=0 and PZ7 ... PZ1=1, the content of the cell PZ8 is transferred into the cell PZ5 synchronously with a clock signal CLK. Respectively synchronously with the clock signal CLK, the transfers into the cell PZ2, into the cell PZ7, into the cell PZ4, into the cell PZ1, into the cell PZ6 and into the cell PZ3 successively occurs in the indicated sequence before the transfer into the output cell PZ8 occurs. These transfers are respectively illustrated as arrows in FIG. 5.

Figure 6:
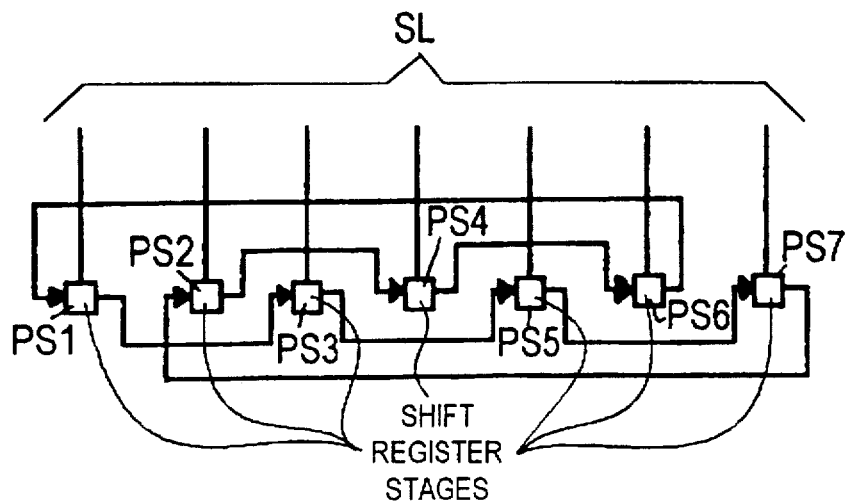
FIG. 6 is a block circuit diagram of the column selection unit of the memory unit of FIG. 1 for the case of the access sequence of FIG. 4.

FIG. 6 shows a corresponding column addressing unit SPTR that drives the switches SCH for the respective column lines. As in FIG. 4, the column addressing unit is designed, by way of example, for seven columns and a column skip width SSW=2. The column addressing unit is composed of a shift register with seven cyclically switched shift register stages PS1 ... PS7. Beginning with an initial condition PS1=1 and PS2 ... PS7=0, or with an initial condition PS1=0 and PS2 ... PS7=1, a first information transfer from the shift register stage PS1 onto the shift register stage PS3 occurs dependent on a clock signal CLK and then onto the shift register stages PS5, PS7, PS2, PS4 and PS6 in sequence before a carry back to the shift register unit PS1 occurs. The outputs of the register stages PS1 ... PS7 are allocated in sequence to the column lines SL for the columns 1 ... 7.

The overall memory unit can thereby also be rotated by 90°, and the rows and columns as well as the row skip width and the column skip with are interchanged with one another.

Although various minor changes and modifications might be proposed by those skilled in the art, it will be understood that our wish is to include within the claims of the patent warranted hereon all such changes and modifications as reasonably come within our contribution to the art.

We claim as our invention:

1. A memory unit with serial access, comprising:

a memory matrix whose memory cells are arranged in Z rows and S columns, and wherein the memory cells are connected to row lines and column lines;

a row clock signal and a column clock signal that are formed from an external clock signal in a clock logic unit;

a row selection unit connected to the row lines and indexed cyclically by a predetermined row skip width ZSW for row selection with every row clock signal;

a column selection unit connected to the column lines and indexed cyclically by a predetermined column skip width SSW for column selection with every column clock signal; and the row selection unit and the column selection unit being designed such that a respectively new row is already selected after n columns have been selected or a respectively new column is selected after m rows have been selected, where n is smaller than S and m is smaller than Z and a higher of the two numbers n and m represents a plurality of bits in a memory word that can still be corrected by a code.

2. The memory unit according to claim 1 wherein the respectively new row is already selected after the n columns have been selected and the respectively new column is selected after the m rows have been selected.

3. The memory unit according to claim 1 wherein:

both the row selection unit as well as the column selection unit comprise shift registers interconnected to form a ring in which either a single logical one or a single logical zero are respectively cyclically shifted;

the row clock signal and the column clock signal are respectively formed such that the clock ratio of row clock to column clock is greater than 1 through S or smaller than Z;

the row selection unit is synchronously indexed with the row clock signal; and the column selection unit is synchronously indexed with the column clock signal.

4. The memory unit according to claim 3 wherein the clock ratio of the row clock to the column clock is greater than 1 through S and smaller than Z.

5. The memory unit according to claim 4, wherein both the row clock signal and the column clock signal are identical to the external clock signal.

6. The memory unit according to claim 4, wherein:

the row selection unit and the column selection unit are designed such that a row change also always simultaneously occurs with each column change; and the row number Z and the column number S of the memory matrix, the row skip width ZW and the column skip width SSW meet the conditions

GGT(S,SSW)=1 and

GGT(Z,(S*ZSW) MOD Z)=1, where GGT denotes a greatest common divisor and MOD denotes a modulo operation.

7. The memory unit according to claim 1, wherein individual shift registers are allocated to the row lines and column lines such that a desired row skip width ZSW and a desired column skip width SSW result during the row and column selection.

* * * * *